(12) United States Patent
Liu et al.

(10) Patent No.: US 6,380,773 B1
(45) Date of Patent: Apr. 30, 2002

(54) PRESCALAR USING FRACTION DIVISION THEORY

(75) Inventors: Shen-Iuan Liu, Taipei; Jian-Ming Yang, Kaohsiung, both of (TW)

(73) Assignee: National Science Council, Taipei (TW)

( * ) Notice: Subject to any disclaimer, the term of this patent is extended or adjusted under 35 U.S.C. 154(b) by 0 days.

(21) Appl. No.: 09/727,945

(22) Filed: Dec. 1, 2000

(51) Int. Cl.[7] ............................................... H03B 19/00
(52) U.S. Cl. ......................................... 327/117; 377/48
(58) Field of Search ................................ 327/115, 117, 327/118; 377/47, 48

(56) References Cited

U.S. PATENT DOCUMENTS

| | | | | |
|---|---|---|---|---|
| 4,163,946 A | * | 8/1979 | Alberts | 327/115 |
| 4,488,123 A | * | 12/1984 | Kurihara | 327/105 |
| 4,851,787 A | * | 7/1989 | Martin | 331/1 A |
| 5,948,046 A | * | 9/1999 | Hagberg | 377/47 |

* cited by examiner

Primary Examiner—Kenneth B. Wells
Assistant Examiner—Linh Nguyen
(74) Attorney, Agent, or Firm—J.C. Patents

(57) ABSTRACT

A prescalar using the fractional division theory. The prescalar is a critical circuit in a phase-locked loop based frequency synthesizer to provide a high frequency operation. The prescalar is also an important subassembly. Using four translucent circuits and one divisor selection circuit, a two mode frequency divider synchronously divided by 4/5 is synthesized to synthesize the fraction function. The load capacitance can be effectively reduced. Meanwhile, a reset TSPC flip flop can be designed to effectively and quickly perform the reset operation, and to assemble a two mode frequency divider synchronously divided by 16/13. The invention uses standard 0.25 μm CMOS fabrication process to obtain a maximum operation frequency of 6 GHz under a 2V operation voltage. The chip system integration can thus be enhanced.

9 Claims, 4 Drawing Sheets

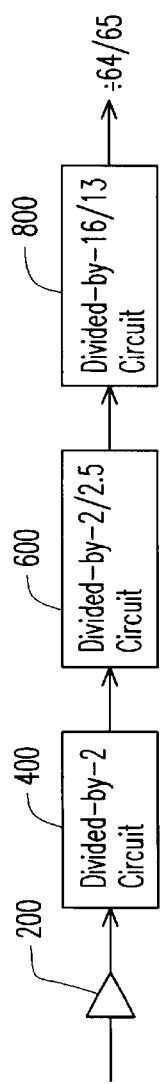
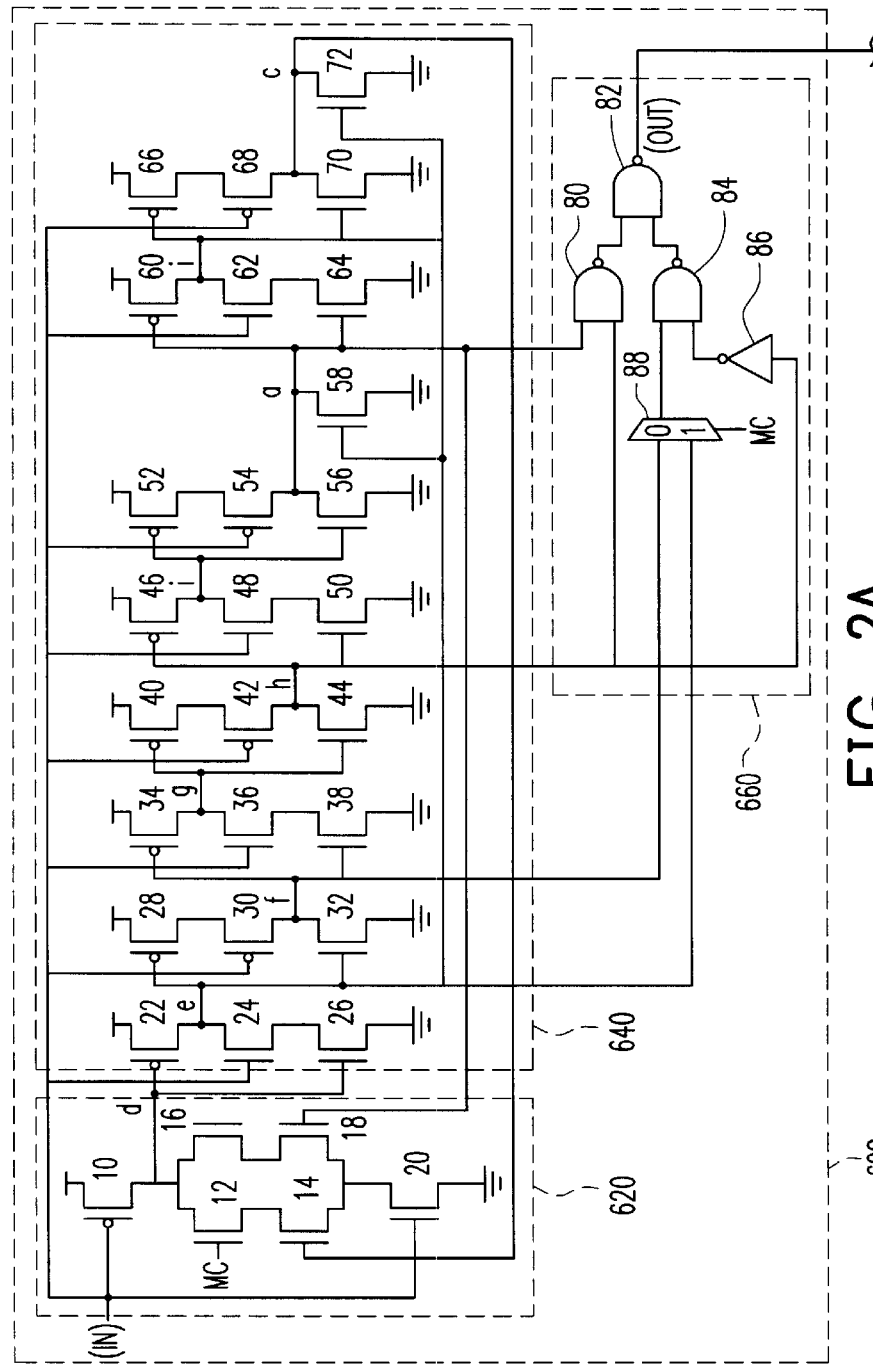

PRESCALAR USING FRACTION DIVISION THEORY

BACKGROUND OF THE INVENTION

1. Field of the Invention

The invention relates in general to a prescalar. More particularly, the invention relates to prescalar using fraction division theory.

2. Description of the Related Art

A conventional prescalar comprises a two mode frequency divider synchronously divided by 4/5 and a circuit non-synchronously divided by 16. The minimum amplitude signal output by a bias control oscillator can be converted into a large pushable digital logic signal. At the front end of the circuit, an input amplifier is typically installed. While adapting such high speed logic in dynamic logic, the maximum operation frequency is not restricted by the operation speed of the logic circuit, but the frequency response of the input amplifier. When the frequency response of input amplifier is directly determined by the load capacitor, that is, by the input capacitance load of the logic circuit portion of the prescalar, the synchronous frequency divider is normally constructed of three circuits divided by 2. That, the synchronous frequency divider includes three flip flops. For the input amplifier, the load is the clock load of the three flip flops.

SUMMARY OF THE INVENTION

The invention provides a prescalar using fraction division theory. An input amplifier only drives one divided-by-2 circuit, that is, the load thereof is a clock load of a single flip flop. Therefore, a higher frequency response of the input amplifier can be obtained compared to the conventional structure. As a result, the maximum operation frequency of the prescalar can be enhanced.

The invention uses a divided-by-2 circuit divided and a synchronously divided-by-2/2.5 two mode frequency divider to replace the conventional two mode frequency divided by 4/5, and a non-synchronously divided-by-16/13 two mode frequency divider and an input amplifier. The divided-by-2/2.5 two mode frequency divider synchronously comprises a divisor selection circuit, a plurality translucent circuits and a synthesized divided-by-2/2.5 logic circuit. The non-synchronously divided-by-16/13 two mode frequency divider comprises a reset flip flop, an erase flip flop and a reset control logic NOR gate.

The divisor selection circuit of the two mode frequency divider synchronously divided by 2/2.5 comprises a first to a sixth transistors. The first transistor comprises a gate coupled to an input terminal IN. A drain of the second transistor is coupled to a source of the first transistor. A drain of the fourth transistor is coupled to the source of the first transistor. The drain of the third transistor is coupled to a source of the second transistor. A drain of the fifth transistor is coupled to a source of the fourth transistor. A source region of the third transistor is coupled to a source of the fifth transistor. A drain of the sixth transistor is coupled to a source of the fifth transistor. A gate of the sixth transistor is coupled to the input terminal. A source of the sixth transistor is coupled to ground.

The translucent circuits of the synchronously divided-by-2/2.5 two mode frequency divider comprises the seventh to the thirty-second transistors. A drain of the eighth transistor is coupled to a source of the seventh transistor. A gate of the tenth transistor is coupled to the drain of the eighth transistor. A drain of the ninth transistor is coupled to a source of the eighth transistor. A gate of the ninth transistor is coupled to a gate of the seventh transistor. A source of the ninth transistor is grounded. A gate of the eleventh transistor is coupled to a gate of the eighth transistor. A drain of the eleventh transistor is coupled to a source of the tenth transistor. A drain of the twelfth transistor is coupled to a source of the eleventh transistor. A source of the twelfth transistor is grounded. A gate of the twelfth transistor is coupled to the drain of the eighth transistor. A gate of the thirteenth transistor is coupled to the drain of the twelfth transistor. A drain of the fourteenth transistor is coupled to a source of the thirteenth transistor. A gate of the fourteenth transistor is coupled to the gate of the eleventh transistor. A gate of the fifteenth transistor is coupled to the gate of the thirteenth transistor. A source of the fifteenth transistor is grounded. A gate of the sixteenth transistor is coupled to the drain of the fourteenth transistor. A gate of the seventeenth transistor is coupled to a gate of the fourteenth transistor. A drain of the seventeenth transistor is coupled to a source of the sixteenth transistor. A gate of the eighteenth transistor is coupled to the drain of the fourteenth transistor. A source of the eighteenth transistor is grounded. A drain of the eighteenth transistor is coupled a source of the seventeenth transistor. A gate of the nineteenth transistor is coupled to a drain of the eighteenth transistor. A drain of the twentieth transistor is coupled to a source of the nineteenth transistor. A gate of the twentieth transistor is coupled to the gate of the seventeenth transistor. A gate of the twenty-first transistor is coupled to the gate of the nineteenth transistor. A source of the twenty-first transistor is coupled to ground. A gate of the twenty-second transistor is coupled to the drain of the twentieth transistor. A gate of the twenty-third transistor is coupled to the gate of the twentieth transistor. A drain of the twenty-third transistor is coupled to a source of the twenty-second transistor. A gate of the twenty-fourth transistor is coupled to the drain of the twentieth transistor. A source of the twenty-fourth transistor is connected to ground. A drain of the twenty-fourth transistor is coupled to a source of the twenty-third transistor. A drain of the twenty-fifth transistor is coupled to a drain of the twenty-fourth transistor. A gate of the twenty-fifth transistor is coupled to ground. A gate of the twenty-sixth transistor is coupled to a drain of the twenty-fifth transistor. A drain of the twenty-seventh transistor is coupled to a source of the twenty-sixth transistor. A gate of the twenty-seventh transistor is coupled to the gate of the twenty-third transistor. A gate of the twenty-eighth transistor is coupled to the gate of the twenty-sixth transistor. A source of the twenty-eighth transistor is coupled to ground. A gate of the twenty-ninth transistor is coupled to drain of the twenty-seventh transistor. A gate of the thirtieth transistor is coupled to the gate of the twenty-seventh transistor. A drain of the thirtieth transistor is coupled to a source of the twenty-ninth transistor. A gate of the thirty-first transistor is coupled to the drain of the twenty-seventh transistor. A source of the thirty-first transistor is coupled to ground. A drain of the thirty-first transistor is coupled to a source of the thirtieth transistor. A drain of the thirty-second transistor is coupled to the drain of the thirty-first transistor. A gate of the thirty-second transistor is coupled to the gate of the twenty-fifth transistor. A source of the thirty-second transistor is grounded.

The synthesized divided-by-2/2.5 logic circuit of the synchronously-divided-by-2/2.5 two mode frequency divider comprises a first NAND logic gate, a second NAND logic gate, a third NAND logic gate, a multiplexer and a NOT logic gate. The second NAND logic gate comprises a second input terminal coupled to an output terminal of the first NAND logic gate. An output terminal of the third NAND logic gate is coupled to a second input terminal of the second NAND logic gate. An output terminal of the multiplexer is coupled to a first output terminal of the third NAND logic gate. A first terminal of the NOT logic gate is coupled to a second input terminal fo the third NAND logic gate.

The non-synchronously divided-by-$^{16}/_{13}$ two mode frequency divider comprises a first flip flop to a fifth flip flop and a NOR logic gate. The first flip flop comprises a first input terminal to a first output terminal thereof A first input terminal of the second flip flop is coupled to its first output terminal. A second input terminal of the second flip flop is coupled to a second input terminal of the first flip flop. A SET terminal of the second flip flop is coupled to a SET terminal of the first flip flop. A first input terminal of the third flip flop is coupled to a first output terminal of the third flip flop. A second input terminal of the third flip flop is coupled to a second output terminal of the second flip flop. A CLR terminal of the third flip flop is coupled to the SET terminal of the second flip flop. A first input terminal of the fourth flip flop is coupled to a first output terminal of the fourth flip flop. A second input terminal of the fourth flip flop is coupled to the second output terminal of the third flip flop. A SET terminal of the fourth flip flop is coupled to the CLR terminal of the third flip flop. A second output terminal of the fourth flip flop is coupled to the output terminal (OUT). The NOR logic gate comprises a first input terminal coupled to the second output terminal of the first flip flop, a second input terminal coupled to the second output of the second flip flop, a third input terminal coupled to the second output terminal of the third flip flop. The NOR logic gate further comprises a fourth input terminal coupled to the second input terminal of the fourth flip flop. The fifth flip flop has a SET terminal coupled to the output terminal of the NOR logic gate, a second input terminal coupled to the second input terminal of the first flip flop. A PRESET terminal of the fifth flip flop is coupled to the SET terminal of the fourth flip flop.

According to the above structure, the prescalar provided by the invention comprises a two mode frequency divider synchronously divided by $^2/_{2.5}$ to replace the two mode frequency divider divided by $^4/_5$ used in the conventional structure. Together with a two mode frequency divider nonchronously divided by $^{13}/_{16}$, if the circuit is divided by 64, the divided-by-$^2/_{2.5}$ circuit has to be divided by 2, so that the divided-by-$^{16}/_{13}$ circuit has to be the divided-by-16 mode. With the aids of the divided-by-2 circuit, the total divisor is 64. If the circuit is to be divided by 65, the circuit divided by $^2/_{2.5}$ is set at divided-by-2.5 mode, and the circuit divided by $^{16}/_{13}$ is set at divided-by-13 mode. With the assistance of the circuit divided by 12.5, the total divisor is 65.

Both the foregoing general description and the following detailed description are exemplary and explanatory only and are not restrictive of the invention, as claimed.

BRIEF DESCRIPTION OF THE DRAWINGS

FIG. 1 shows a block diagram of a prescalar using fractional division according to the invention;

DESCRIPTION OF THE PREFERRED EMBODIMENTS

The prescalar using fractional division theory provided by the invention comprises an input amplifier 200, a divided-by-2 circuit 400, a synchronously divided-by-$^2/_{2.5}$ two mode frequency divider 600, and a non-synchronously divided-by-$^{13}/_{16}$ two mode frequency divider 800. The input amplifier only needs to drive one divided-by-2 circuit 400, that is, the load is a clock load of a single flip flop. Therefore, the input amplifier can have a higher frequency response to enhance the maximum operation speed of the prescalar.

FIG. 1 is a block diagram of the prescalar using fraction division theory. The input amplifier 200 amplifies a signal to an operable digital level of the prescalar. The input amplifier 200 is coupled to the divided-by-2 400 which divides the input digital level signal by 2. A divided-by-2 signal is output. The divided-by-2 circuit 400 is coupled to the synchronously divided-by-$^2/_{2.5}$ two mode frequency divider 600. The divided-by-2 signal is then divided by $^2/_{2.5}$, so that a divided-by-$^2/_{2.5}$ signal is output. The synchronously divided-by-$^2/_{2.5}$ two mode frequency divider 600 is coupled to the non-synchronously divided-by-$^{16}/_{13}$ two mode frequency divider 800, so that the divided-by-$^2/_{2.5}$ signal is divided by $^{16}/_{13}$, and a divided-by-$^{16}/_{13}$ signal is output.

Figure 2B:
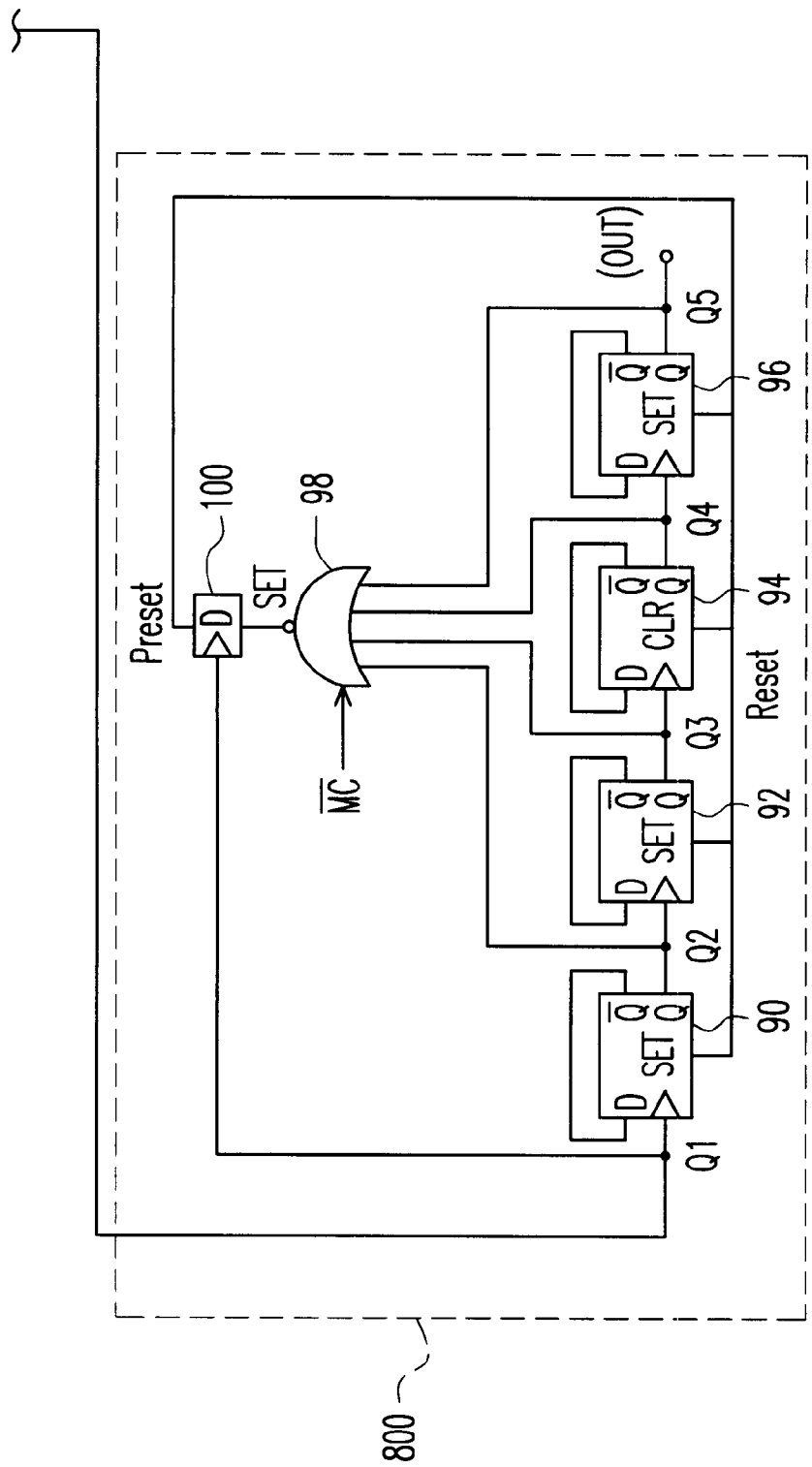
FIG. 2 shows a circuit diagram of a prescalar that uses the fractional division and comprises a synchronously divided-by-2.5 two mode frequency divider and a non-synchronously divided-by-$^{13}/_{16}$ two mode frequency divider according to the invention.

FIG. 2 shows a circuit diagram of the synchronously divided-by-$^2/_{2.5}$ two mode frequency divider 600 and the non-synchronously divided-by-$^{13}/_{16}$ two mode frequency divider 800. The synchronously divided-by $^2/_{2.5}$ two mode frequency divider 600 comprises a divisor selection circuit 620, four translucent circuit 640 and a synthesized divided-by-$^2/_{2.5}$ logic circuit 660. The divided-by-signal input terminal (IN) is coupled to the divisor selection circuit 620. When the input divisor selection signal MCI is 0, the whole circuit is divided by 4. When the input divisor selection signal is 1, the whole circuit is divided by 5 and coupled to the four translucent circuits 640 which show the waveform signal in each node. The divisor signal and the four translucent signals are used to synthesize a new synchronously divided-by-$^4/_5$ two mode frequency divider, and then coupled to the synchronously divided-by-$^2/_{2.5}$ two mode frequency divider 660 to obtain the divided-by-$^2/_{2.5}$ waveform required by the divided-by-$^2/_{2.5}$ for the waveform signal synthesis at each node of the translucent circuits 640. The non-synchronously divided-by-$^{16}/_{13}$ two mode frequency divider 800 is coupled to the synthesized divided-by-$^2/_{2.5}$ logic circuit 660. The synthesized divided-by-$^2/_{2.5}$ waveform is divided by 16 or 13 to output a waveform after being divided.

In FIG. 2, the divisor selection circuit 620 comprises a first transistor 10 to a sixth transistor 20. Each transistor comprises a gate, a drain and a source. The gate of the first transistor 10 is coupled to an input terminal IN. The drain of the second transistor 12 is coupled to the source of the first transistor 10. The drain of the fourth transistor 16 is coupled to the source of the first transistor. The drain of the third transistor 14 is coupled to the source of the second transistor 12. The drain of the fifth transistor 18 is coupled to the source of the fourth transistor 16. The source of the third transistor 14 is coupled to the fifth transistor 18. The drain of the sixth transistor 20 is coupled to the source of the fifth transistor 18. The gate of the sixth transistor 20 is coupled to the input terminal IN of the divided-by-2 circuit 400. The source of the sixth transistor 20 is grounded.

The translucent circuits 640 as shown in FIG. 2 comprises a seventh transistor 22 to a thirty-second transistor 72. Each of the transistors 22 to 72 comprises a gate, a drain and a source. The gate of the seventh transistor 22 is coupled to the source of the first transistor 10 of the divisor selection circuit 620. The drain of the eighth transistor 24 is coupled to the source of the seventh transistor 22. The gate of the eighth transistor 24 is coupled to the gate of the first transistor 10 of the divisor selection circuit 620. The gate of the tenth transistor is coupled to the drain of the eighth transistor 24. The drain of the ninth transistor 26 is coupled to the source of the eighth transistor 24. The gate of the ninth transistor 26 is coupled to the gate of the seventh transistor 22. The source of the ninth transistor 26 is grounded. The gate of the eleventh transistor 30 is coupled to the gate of the eighth transistor 24. The drain of the eleventh transistor 30 is coupled to the source of the tenth transistor 28. The drain of the twelfth transistor 32 is coupled to the source of the eleventh transistor 30. The source of the twelfth transistor is grounded. The gate of the twelfth transistor 32 is coupled to the drain of the eighth transistor 24. The gate of the thirteenth transistor 34 is coupled to the drain of the twelfth transistor 32. The drain of the fourteenth transistor 36 is coupled to the source of the thirteenth transistor 34. The gate of the fourteenth transistor 36 is coupled to the gate of the eleventh transistor 30. The gate of the fifteenth transistor 38 is coupled to the gate of the thirteenth transistor 34. The source of the fifteenth transistor 38 is coupled to ground. The gate of the sixteenth transistor 40 is coupled to the drain of the fourteenth transistor 36. The gate of the seventeenth transistor 42 is coupled to the gate of the fourteenth transistor 36. The drain of the seventeenth transistor 42 is coupled to the source of the sixteenth transistor 40. The gate of the eighteenth transistor 44 is coupled to the drain 36 of the fourteenth transistor 36. The source of the eighteenth transistor 44 is grounded. The drain of the eighteenth transistor 44 is coupled to the source of the seventeenth transistor 42. The gate of the nineteenth transistor 46 is coupled to the drain of the eighteenth transistor 44. The drain of the twentieth transistor 48 is coupled to the source of the nineteenth transistor 46. The gate of the twentieth transistor 48 is coupled to the gate of the seventeenth transistor 42. The gate of the twenty-first transistor 50 is coupled to the gate of the nineteenth transistor 46. The source of the twenty-first transistor 50 is grounded. The gate of the twenty-second transistor 52 is coupled to the drain of the twentieth transistor 48. The gate of the twenty-third transistor 54 is coupled to the gate of the twentieth transistor 48. The drain of the twenty-third transistor 54 is coupled to the source of the twenty-second transistor 52. The gate of the twenty-fourth transistor 56 is coupled to the drain of the twentieth transistor 48. The source of the twenty-fourth transistor 56 is grounded. The drain of the twentieth transistor 56 is coupled to the source of the twentieth transistor 54. The drain of the twenty-fifth transistor 58 is coupled to the drain of the twenty-fourth transistor 56. The gate of the twenty-fifth transistor 58 is coupled to the gate of the twelfth transistor 32. The source of the twenty-fifth transistor 58 is coupled to ground. The gate of the twenty-sixth transistor 60 is coupled to the drain of the twenty-fifth transistor 58. The drain of the twenty-seventh transistor 62 is coupled to the source 60 of the twenty-sixth transistor 60. The gate of the twenty-seventh transistor 62 is coupled to the gate of the twenty-third transistor 54. The gate of the twenty-eighth transistor 64 is coupled to the gate of the twenty-sixth transistor 60. The source of the twenty-eighth transistor 64 is coupled to the gate of the fifth transistor 18 in the divisor selection circuit 620. The gate of the twenty-ninth transistor 66 is coupled to the drain of the twenty-seventh transistor 62. The gate of the thirtieth transistor 68 is coupled to the gate of the twenty-ninth transistor 66. The gate of the thirty-first transistor 70 is coupled to the drain of the twenty-seventh transistor 62. The source of the thirty-first transistor 70 is grounded. The drain of the thirty-first transistor 70 is coupled to the source of the thirtieth transistor 68. The drain of the thirty-second transistor 72 is coupled to the drain of the thirty-first transistor 70. The gate of the thirty-second transistor 72 is coupled to the gate of the twenty-fifth transistor 58. The source of the thirty-second transistor 72 is coupled to ground. The drain of the thirty-second transistor 72 is further coupled to the gate of the third transistor 14 of the divisor selection circuit 620.

The synthesized divided-by-$2/2.5$ logic circuit 660 comprises a first NAND logic gate 80, a second NAND logic gate 82, a third NAND logic gate 84, a multiplexer 88 and a NOT logic gate 86. Each of the first, second and third NAND logic gates has a first input terminal, a second terminal and an output terminal. The first input terminal of the first NAND logic gate 80 is coupled to the drain of the twenty-fifth transistor 58 of the translucent circuit 640. The second input terminal of the first NAND logic gate 80 is coupled to the drain of the eighteenth transistor 44. The first input terminal of the second NAND logic gate 82 is coupled to the output terminal of the first NAND logic gate 80. The output terminal of the third NAND gate is coupled to the second input terminal of the second NAND logic gate 82. The multiplexer 88 comprises a first input terminal, a second input terminal, an output terminal and a control signal (MC). The first input terminal of the multiplexer 88 is coupled to the drain of the twelfth transistor 32. The second input terminal of the multiplexer 88 is coupled to the gate of the twelfth transistor 32. The output terminal of the multiplexer 88 is coupled to the first input terminal of the third NAND logic gate 84. The NOT logic gate 86 comprises an input terminal and an output terminal. The input terminal of the NOT logic gate 86 is coupled to the second input terminal of the second NAND logic gate 80, and the output terminal of the NOT gate 86 is coupled to the second input terminal of the second NAND logic gate 84.

The non-synchronously divided-by-$16/13$ two mode frequency divider 800 comprises a first flip flop 90 to a fifth flip flop 100 and a NOR logic gate 98. The first flip flop 90 comprises a first input terminal, a second input terminal, a first output terminal, a second output terminal and a SET terminal. The first input terminal and the first output terminal of the first flip flop 90 are coupled to each other. The second input terminal of the first flip flop 90 is coupled to the output terminal of the second NAND logic gate 82 of the synthesized divided-by-$2/2.5$ logic circuit 660. The second flip flop 92 comprises a first input terminal, a second input terminal, a first output terminal, a second output terminal and a SET terminal. The first input terminal and the first output terminal of the second flip flop 92 are coupled to each other. The second input terminal of the second flip flop 92 is coupled to the second output terminal of the first flip flop 90. The SET terminal of the second flip flop 92 is coupled to the SET terminal of the first flip flop 90. The third flip flop 94 comprises a first input terminal, a second input terminal, a first output terminal, a second output terminal and a CLR terminal. The first input terminal and the first output terminal of the third flip flop 94 are coupled to each other. The second input terminal of the third flip flop 94 is coupled to the second output terminal of the second flip flop 92. The CLR terminal of the third flip flop 94 is coupled to the SET terminal of the second flip flop 92. The fourth flip flop 96 comprises a first input terminal, a second input terminal, a first output terminal, a second output terminal and a SET terminal. The first input and output terminals of the fourth flip flop 96 are coupled to each other. The second input terminal of the fourth flip flop 96 is coupled to the second input terminal of the third flip flop 94. The SET terminal of the fourth flip flop 96 is coupled to the CLR terminal of the third flip flop 94. The second output terminal of the fourth flip flop 96 is coupled to the output terminal (Out) of the second NAND logic gate 82, that is, the output terminal of the non-synchronously divided-by-16/13 two mode frequency divider 660. The NOR logic gate 98 comprises a first input terminal, a second input terminal, a third input terminal, a fourth input terminal and an output terminal. The first input terminal of the NOR logic gate 98 is coupled to the second output terminal of the first flip flop 90. The second input terminal of the NOR logic gate 98 is coupled to the second output terminal of the second flip flop 92. The third input terminal of the NOR logic gate 98 is coupled to the second output terminal of the third flip flop 94. The fourth input terminal of the NOR logic gate 98 is coupled to the second output terminal of the fourth flip flop 96. The fifth flip flop 100 comprises a first input terminal, a second input terminal, a first output terminal, a second output terminal, a SET terminal and a PRESET terminal. The SET terminal of the fifth flip flop 100 is coupled to the output terminal of the NOR logic gate 98. The second input terminal of the fifth flip flop 100 is coupled to the second input terminal of the first flip flop 90. The PRESET terminal of the fifth flip flop 100 is coupled to the SET terminal of the fourth flip flop 96.

When the divisor selection signal MC1 is 0, the whole circuit performs a divided-by-4 operation. The divided-by-4 signal appears at the major signal nodes denoted as a, b, c, d, e, f, g, h, i. However, the waveform at each of the signal nodes is different. When the input divisor selection signal MC1 is 1, the whole circuit is divided by 5. A divided-by-5 signal appears at the nodes a, b, c, d, e, f, g, h, i. Again, the waveform at each node is different from others.

Figure 3:
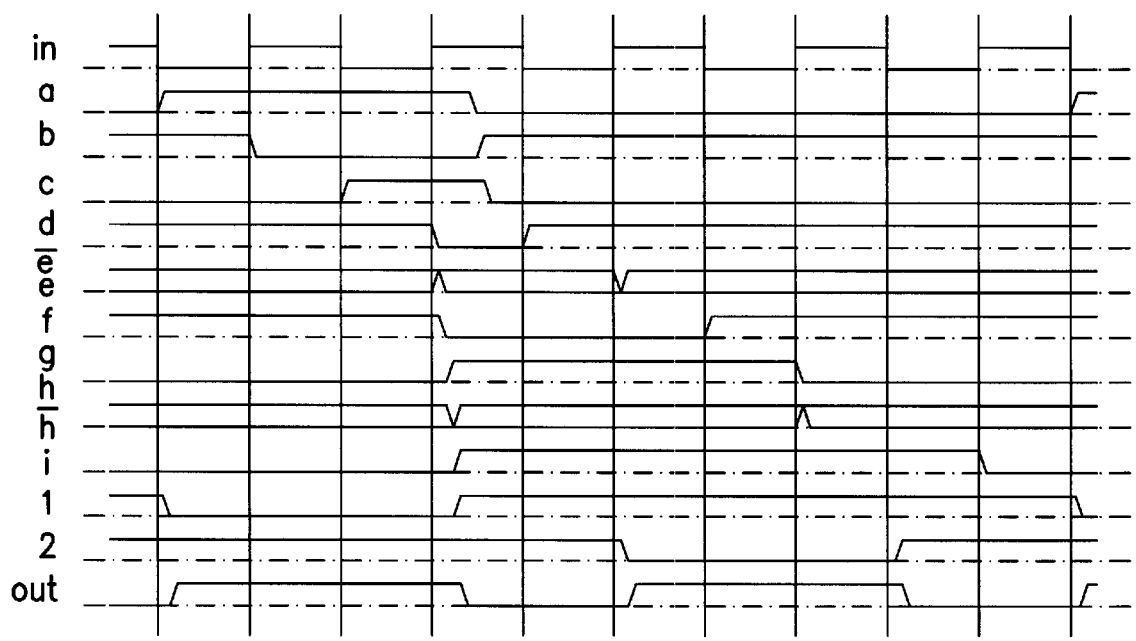
FIG. 3 shows the divided-by-2.5 clock diagram and the waveform composite graph of the divided-by-2.5 clock of the prescalar using fractional division theory.
Figure 4:
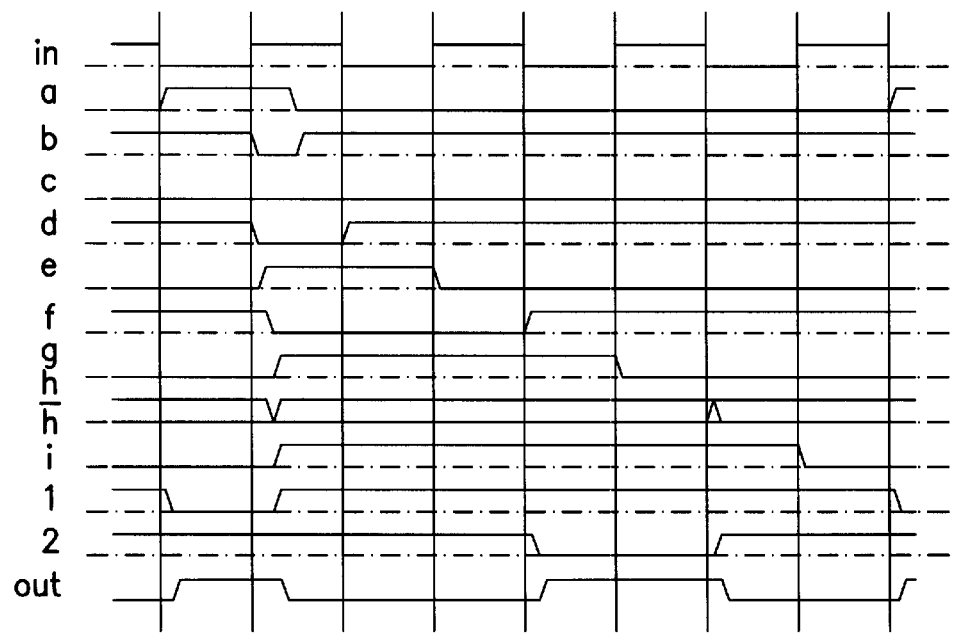
FIG. 4 shows the divided-by-2 clock diagram and the waveform composite graph of the divided-by-2 clock of the prescalar using fractional theory.

As the waveform at each node is different from others, different node signal is used to synthesize the fractional division output. Referring to FIG. 3, the clock diagram and the divided-by-2.5 waveform synthesis diagram are shown. This is a signal periodic waveform during the divided-by-5 operation of the synchronously divided-by-4/5. Therefore, it is known that due to the characteristics of the translucent circuits 640, the waveform at each node has a delay compared to the waveform of its previous node. The required rising edge of the synthesized divided-by-2.5 signal can be obtained. If the rising edge at the node a is the first rising edge of the output divided-by-2.5 signal, the descending edge of the node e can generate the second rising edge required by the divided-by-2.5 signal. The switch between these two signals can be selected by the h node signal. Similarly, referring to FIG. 4, the clock diagram and the divided-by-2 waveform synthesis are shown. This is a signal periodic waveform of the synchronously divided-by-4/5 two mode frequency divider. It can be observed that the nodes of a and f can synthesize the rising edges of these two signals, and the switch can of these two node signals can be selected by the node h. Thus, the synthesized divided-by-2/2.5 600 is used to synthesize the divided-by-2/2.5 waveform.

Figure 5:
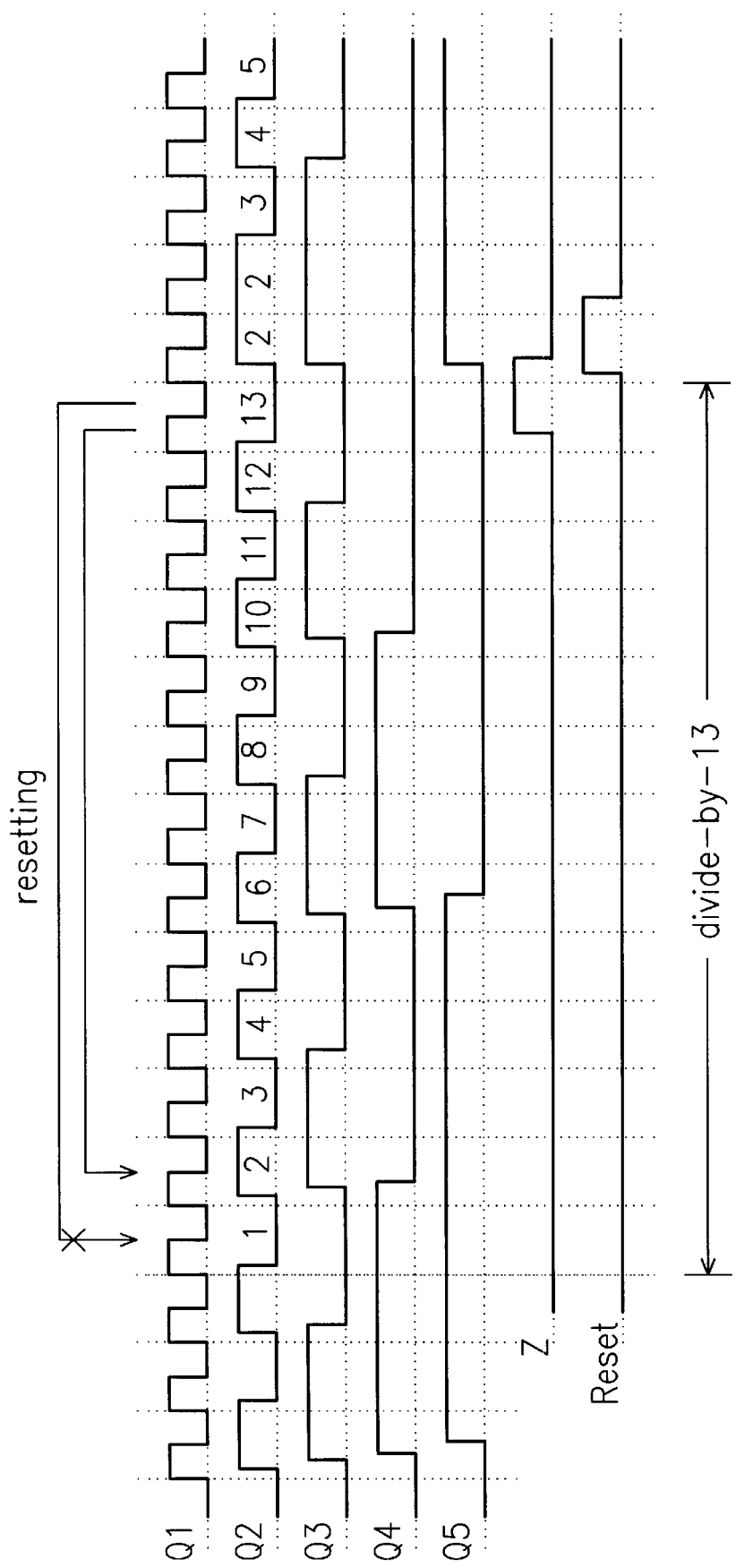
FIG. 5 shows the sequence of the divided-by-13 function of the prescalar using the fractional division theory according to the invention.

The non-synchronously divided-by-16/13 comprises a first, second and fourth flip flops 90, 92 and 62 as the reset flip flops. The third flip flop 94 included thereby is used as an erase flip flop. The NOR logic gate 98 is a reset control logic NOR gate. When the input external control signal MC-bar is 1, the output of the NOR logic gate 98 is set for not resetting all the time. Therefore, the non-synchronously divided-by-16/13 two mode frequency divider 800 operates at a normal divided-by-16 function. The operation theory can be referred to FIG. 5, which illustrates the sequence of the divided-by-13 function for the non-synchronously divided-by-16/13 two mode frequency divider 800. When Q2–Q5 are counted to 0, and Z=1, the circuit is not directly reset. However, the next flip flop is used to buffer the reset signal. The circuit is reset while the next clock approaches. The reset signal Reset will remains for a period, and the reset operation has to be reset into 2 instead of 1. The divisor can thus be obtained correctly.

According to the above, the prescalar provided by the invention uses a divided-by-2 circuit and a synchronously divided-by-2/2.5 two mode frequency divider to replace the conventional structure of the divided-by-4/5 two mode frequency divider. The input amplifier needs only drive one divided-by-2 circuit. The load is thus a clock load of a single flip flop, so that the frequency response of the input amplifier is increased. The maximum operation frequency of the prescalar is thus increased.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A prescalar using a fractional division theory, comprising:
   an input amplifier, amplifying a signal to an operable digital level of the prescalar;
   a divided-by-2 circuit, coupled to the input amplifier to divide the digital level signal by 2, and to output the divided-by-2 signal;
   a synchronously divided-by 2/2.5 two mode frequency divider, coupled to the divided-by-2 circuit to divide the divided-by-2 signal by 2.5, and to output the divided-by-2.5 signal; and
   a non-synchronously divided-by-16/13 two mode frequency divider, coupled to the synchronously divided-by-2/2.5 two mode frequency divider, to divide the divided-by-2/2.5 signal by 16/13, and to output the divided-by-16/13 signal.

2. The prescalar according to claim 1, wherein the synchronously divided-by 2/2.5 two mode frequency divider comprises:
   a divisor selection circuit, coupled to the divided-by-2 circuit to select an input divisor signal;
   a translucent circuit, coupled to the divisor selection circuit to perform a divided-by-4/5 operation to generate a divided-by-4/5 signal, when an input divisor signal MC1 of the divisor selection circuit is 0, the translucent circuit performs a divided-by-5 operation, and when the input divisor signal MC1 is 1, the translucent circuit performs a divided-by-4 operation; and
   a synthesized divided-by-2/2.5 logic circuit, coupled to the translucent circuit to synthesize a waveform on each of a plurality of nodes of the translucent circuit, so as generate a divided-by-2/2.5 waveform signal, the synthesized divided-by-2/2.5 logic circuit adapting one of divided-by-4/5 waveforms on the translucent circuit to synthesize the required divided-by-2/2.5 waveform signal.

3. The prescalar according to claim 1, wherein the non-synchronously divided-by-$16/13$ two mode frequency divider comprises:
   a flip flop, coupled to the synthesized divided-by-$2/2.5$ logic circuit to divide the divided-by-$2/2.5$ waveform signal for reset and erase; and
   a reset control NOR logic gate, coupled to the flip flop to perform a reset operation.

4. The prescalar according to claim 2, wherein the divisor selection circuit comprises:
   a first transistor, having a gate, a drain and a source, wherein the gate is coupled to an input terminal IN of the divided-by-2 circuit;
   a second transistor, having a gate, a drain and a source, wherein the drain of the second transistor is coupled to the source of the first transistor;
   a fourth transistor, having a gate, a drain and a source, wherein the drain of the fourth transistor is coupled to the source of the first transistor;
   a third transistor, having a gate, a drain and a source, wherein the drain of the third transistor is coupled to the source of the second transistor;
   a fifth transistor, having a gate, a drain and a source, wherein the drain of the fifth transistor is coupled to the source of the fourth transistor, and the source of the third transistor is coupled to the source of the fifth transistor; and
   a sixth transistor, having a gate, a drain and a source, wherein the drain of the sixth transistor is coupled to the input terminal, and the source of the sixth transistor is grounded.

5. The prescalar according to claim 2, wherein the translucent circuit comprises:
   a seventh transistor, having a gate, a drain and a source, wherein the gate of the seventh transistor is coupled to a source of a first transistor of the divisor selection circuit;
   an eighth transistor, having a gate, a drain and a source, wherein the drain of the eighth transistor is coupled to a gate of the first transistor;
   a tenth transistor, having a gate, a drain and a source, wherein the gate of the tenth transistor is coupled to the drain of the eighth transistor;
   a ninth transistor, having a gate, a drain and a source, wherein the drain of the ninth transistor is coupled to the gate of the seventh transistor, and the source of the ninth transistor is grounded;
   an eleventh transistor, having a gate, a drain and a source, wherein the gate of the eleventh transistor is coupled to the gate of the eighth transistor, the drain of the eleventh transistor is coupled to the source of the tenth transistor;
   a twelfth transistor, having a gate, a drain and a source, wherein the drain of the twelfth transistor is coupled to the source of the eleventh transistor, the source of the twelfth transistor is coupled to ground, and the gate of the twelfth transistor is coupled to the drain of the eighth transistor;
   a thirteenth transistor, having a gate, a drain and a source, wherein the gate of the thirteenth transistor is coupled to the drain of the twelfth transistor;
   a fourteenth transistor, having a gate, a drain and a source, wherein the drain of the fourteenth transistor is coupled to the source of the thirteenth transistor, the gate of the fourteenth transistor is coupled to the gate of the eleventh transistor;
   a fifteenth transistor, having a gate, a drain and a source, wherein the gate of the fifteenth transistor is coupled to the gate of the thirteenth transistor, and the source of the fifteenth transistor is coupled to ground;
   a sixteenth transistor, having a gate, a drain and a source, wherein the gate of the sixteenth transistor is coupled to the drain of the fourteenth transistor;
   a seventeenth transistor, having a gate, a drain and a source, wherein the gate of the seventh transistor is coupled to the gate of the fourteenth transistor, the drain of the seventeenth transistor is coupled to source of the sixteenth transistor;
   an eighteenth transistor, having a gate, a drain and a source, wherein the gate of the eighteenth transistor is coupled to the drain of the fourteenth transistor, the source of the eighteenth transistor is coupled to ground, and the drain of the eighteenth transistor is coupled to the source of the seventeenth transistor;
   a nineteenth transistor, having a gate, a drain and a source, wherein the gate of the nineteenth transistor is coupled to the drain of the eighteenth;
   a twentieth transistor, having a gate, a drain and a source, wherein the drain of the twentieth transistor is coupled to the source of the nineteenth transistor, the gate of the twentieth transistor is coupled to the gate of the seventeenth transistor;
   a twenty-first transistor, having a gate, a drain and a source, wherein the gate of the twenty-first transistor is coupled to the gate of the nineteenth transistor, and the source of the nineteenth transistor is coupled to ground;
   a twenty-second transistor, having a gate, a drain and a source, wherein the gate of the twenty-second transistor is coupled to the drain of the twentieth transistor;
   a twenty-third transistor, having a gate, a drain and a source, wherein the gate of the twenty-third transistor is coupled to the gate of the twentieth transistor, and the drain of the twenty-third transistor is coupled to the source of the twenty-second transistor;
   a twenty-fourth transistor, having a gate, a drain and a source, wherein the gate of the twenty-fourth transistor is coupled to the drain of the twentieth transistor, the source of the twenty-fourth transistor is grounded, and the drain of the twenty-fourth transistor is coupled to the source of the twenty-third transistor;
   a twenty-fifth transistor, having a gate, a drain and a source, wherein the drain of the twenty-fifth transistor is coupled to the drain of the twenty-fourth transistor, the gate of the twenty-fifth transistor is coupled to the gate of the twelfth transistor, and the source of the twenty-fifth transistor is grounded;
   a twenty-sixth transistor, having a gate, a drain and a source, wherein the gate of the twenty-sixth transistor is coupled to the drain of the twenty-fifth transistor;
   a twenty-seventh transistor, having a gate, a drain and a source, wherein the drain of the twenty-seventh transistor is coupled to the source of the twenty-sixth transistor, the gate of the twenty-seventh transistor is coupled to the gate of the twenty-third transistor;
   a twenty-eighth transistor, having a gate, a drain and a source, wherein the gate of the twenty-eighth transistor is coupled to the gate of the twenty-sixth transistor, the source of the twenty-eighth transistor is grounded, and the gate of the twenty-eighth transistor is further coupled to a gate of a fifth transistor of the divisor selection circuit;

a twenty-ninth transistor, having a gate, a drain and a source, wherein the gate of the twenty-ninth transistor is coupled to the drain of the twenty-seventh transistor;

a thirtieth transistor, having a gate, a drain and a source, wherein the gate of the thirtieth transistor is coupled to the gate of the twenty-seventh transistor, the drain of the thirtieth transistor is coupled to the source of the twenty-ninth transistor;

a thirty-first transistor, having a gate, a drain and a source, wherein the gate of the thirty-first transistor is coupled to the drain of the twenty-seventh transistor, the source of the thirty-first transistor is grounded, and the drain of the thirty-first transistor is coupled to the source of the thirtieth transistor; and a thirty-second transistor, having a gate, a drain and a source, wherein the drain of the thirty-second transistor is coupled to the drain of the thirty-first transistor and a gate of a third transistor of the divisor selection circuit, and the source of the thirty-second transistor is coupled to ground.

6. The prescalar according to claim 2, wherein the synthesized divided-by-$2/2.5$ logic circuit comprises:

a first NAND logic gate, comprising a first input terminal, a second input terminal and an output terminal, wherein the first input terminal of the first NAND logic gate is coupled to a drain of a twenty-fifth transistor of the translucent circuit, the second input terminal of the first NAND logic gate is coupled to a drain of a tenth transistor of the translucent circuit;

a second NAND logic gate, comprising a first input terminal, a second input terminal and an output terminal, wherein the first input terminal of the second NAND logic gate is coupled to the output terminal of the first NAND logic gate;

a third NAND logic gate, comprising a first input terminal, a second input terminal and an output terminal, wherein the output terminal of the third NAND logic gate is coupled to the second input terminal of the second NAND logic gate;

a multiplexer, comprising a first input terminal, a second input terminal, an output terminal and a control signal, wherein the first input terminal of the multiplexer is coupled to a drain of a twelfth transistor of the translucent circuit, the second input terminal of the multiplexer is coupled to a gate of the twelfth transistor of the translucent circuit, and the output terminal of the multiplexer is coupled to the first input terminal of the third NAND logic gate; and a NOT logic gate, comprising an input terminal coupled to the second input terminal of the first NAND logic gate, and an output terminal coupled to the second input terminal of the third NAND logic gate.

7. The prescalar according to claim 1, wherein the non-synchronously divided-by-$16/13$ two mode frequency divider further comprises:

a first flip flop, comprising a first input terminal, a second input terminal, a first output terminal, a second input terminal and a SET terminal, wherein the first input terminal and the first output terminal of the first flip flop are coupled to each other, and the second input terminal of the first flip flop is coupled to an output terminal of a second NAND logic gate of the synthesized divided-by-$2/2.5$ logic circuit;

a second flip flop, comprising a first input terminal, a second input terminal, a first output terminal, a second input terminal and a SET terminal, wherein the first input terminal and the first output terminal of the second flip flop are coupled to each other, the second input terminal of the second flip flop is coupled to the second output terminal of the first flip flop, and the SET terminal of the second flip flop is coupled to the SET terminal of the first flip flop;

a third flip flop, comprising a first input terminal, a second input terminal, a first output terminal, a second input terminal and a CLR terminal, wherein the first input terminal and the first output terminal of the third flip flop are coupled to each other, the second input terminal of the third flip flop is coupled to the second output terminal of the second flip flop, and the CLR terminal of the third flip flop is coupled to the SET terminal of the second flip flop;

a fourth flip flop, comprising a first input terminal, a second input terminal, a first output terminal, a second input terminal and a SET terminal, wherein the first input terminal and the first output terminal of the fourth flip flop are coupled to each other, the second input terminal of the fourth flip flop is coupled to the second output terminal of the third flip flop, and the SET terminal of the fourth flip flop is coupled to the CLR terminal of the third flip flop;

a NOR logic gate, comprising a first input terminal, a second input terminal, a third input terminal, a fourth input terminal and an output terminal, wherein the first input terminal of the NOR logic gate is coupled to the second input terminal of the first flip flop, the second input terminal of the NOR logic gate is coupled to the second input terminal of the second flip flop, the third input terminal of the NOR logic gate is coupled to the second input terminal of the third flip flop, and the fourth input terminal of the NOR logic gate is coupled to the second input terminal of the fourth flip flop; and a fifth flip flop, comprising a first input terminal, a second input terminal, a first output terminal, a second input terminal, a SET terminal and a PRESET terminal, wherein the SET terminal of the fifth flip flop is coupled to the output terminal of the NOR logic gate, the second input terminal is coupled to the second output terminal of the first flip flop, the PERSET terminal of the fifth flip flop is coupled to the SET terminal of the fourth flip flop.

8. The prescalar according to claim 7, wherein the first flip flop, the second flip flop, and the four flip flop are reset flip flops.

9. The prescalar according to claim 7, wherein the third flip flop includes an erasable flip flop.

* * * * *